United States Patent
Nakayama

(10) Patent No.: US 9,299,791 B2
(45) Date of Patent: Mar. 29, 2016

(54) OXIDE SEMICONDUCTOR THIN FILM AND THIN FILM TRANSISTOR

(71) Applicant: SUMITOMO METAL MINING CO., LTD., Tokyo (JP)

(72) Inventor: Tokuyuki Nakayama, Tokyo (JP)

(73) Assignee: SUMITOMO METAL MINING CO., LTD., Tokyo (JP)

(*) Notice: Subject to any disclaimer, the term of this patent is extended or adjusted under 35 U.S.C. 154(b) by 0 days.

(21) Appl. No.: 14/434,939

(22) PCT Filed: Oct. 10, 2013

(86) PCT No.: PCT/JP2013/077610
§ 371 (c)(1),
(2) Date: Apr. 10, 2015

(87) PCT Pub. No.: WO2014/058019
PCT Pub. Date: Apr. 17, 2014

(65) Prior Publication Data
US 2015/0279943 A1 Oct. 1, 2015

(30) Foreign Application Priority Data
Oct. 11, 2012 (JP) ................................. 2012-226439

(51) Int. Cl.
*H01L 29/10* (2006.01)
*H01L 29/24* (2006.01)
(Continued)

(52) U.S. Cl.
CPC ................ *H01L 29/24* (2013.01); *H01L 29/04* (2013.01); *H01L 29/66969* (2013.01); *H01L 29/7869* (2013.01)

(58) Field of Classification Search
CPC ..... H01L 29/7869; H01L 29/24; H01L 29/04; H01L 29/66969
USPC .......................................................... 257/43
See application file for complete search history.

(56) References Cited

U.S. PATENT DOCUMENTS 8,330,157 B2 * 12/2012 Fujii .................... H01L 51/0022
257/40
2010/0025680 A1 2/2010 Shino et al.
(Continued)

FOREIGN PATENT DOCUMENTS

JP 2008-192721 A 8/2008
JP 2010-045263 A 2/2010
(Continued)

OTHER PUBLICATIONS

International Search Report and Written Opinion dated Jan. 7, 2014, from PCT/JP2013/081445.
(Continued)

*Primary Examiner* — Tu-Tu Ho
(74) *Attorney, Agent, or Firm* — Katten Muchin Rosenman LLP

(57) ABSTRACT

An oxide crystalline thin film having a comparatively high carrier mobility and suitable as TFT channel layer material is provided. The oxide semiconductor thin film of the present invention comprises an oxide that includes indium and tungsten, with the tungsten content in the W/In atomic ratio being 0.005 to 0.12, is crystalline, comprises only the $In_2O_3$ phase of bixbyite structure, and has a carrier density of $1 \times 10^{18}$ cm$^{-3}$ or less and a carrier mobility of higher than 1 cm$^2$/Vsec. The oxide is able to include zinc further with the zinc content in the Z/In atomic ratio of 0.05 or less.

11 Claims, 1 Drawing Sheet

(51) Int. Cl.
*H01L 29/786* (2006.01)
*H01L 29/04* (2006.01)
*H01L 29/66* (2006.01)

(56) References Cited

U.S. PATENT DOCUMENTS

| | | |
|---|---|---|
| 2010/0140609 A1 | 6/2010 | Yano et al. |
| 2011/0168994 A1 | 7/2011 | Kawashima et al. |
| 2011/0198586 A1 | 8/2011 | Inoue et al. |
| 2012/0037897 A1 | 2/2012 | Shiino et al. |
| 2012/0168748 A1 | 7/2012 | Yano et al. |
| 2012/0292617 A1 | 11/2012 | Ebata et al. |

FOREIGN PATENT DOCUMENTS

| | | |
|---|---|---|
| JP | 2010-106291 A | 5/2010 |
| JP | 2010-182924 A | 8/2010 |
| JP | 2010-219538 A | 9/2010 |
| JP | 2010-251604 A | 11/2010 |
| JP | 2010-251606 A | 11/2010 |
| JP | 2011-146571 A | 7/2011 |
| WO | 2008/117739 A1 | 10/2008 |
| WO | 2009/148154 A1 | 12/2009 |
| WO | 2010/047077 A1 | 4/2010 |

OTHER PUBLICATIONS

International Search Report and Written Opinion dated Jan. 14, 2014, from the corresponding PCT/JP2013/077610.

\* cited by examiner

OXIDE SEMICONDUCTOR THIN FILM AND THIN FILM TRANSISTOR

TECHNICAL FIELD

The present invention relates to an oxide semiconductor thin film and a thin film transistor that uses that oxide semiconductor thin film as channel layer material of a thin film transistor.

BACKGROUND ART

A thin film transistor (TFT) is a kind of field effect transistor (FET). The basic structure of a TFT is a three-terminal element that includes a gate terminal, a source terminal and a drain terminal, and is an active element that has a function of using a semiconductor thin film that is formed on a substrate as a channel layer in which electrons or holes move, and when voltage is applied to the gate terminal, controls the current that flows in the channel layer and switches the current between the source terminal and drain terminal.

Currently, polycrystalline silicon film or amorphous silicon film is used as the channel layer of a TFT. Particularly, amorphous silicon film can be formed as a uniform film on a large area tenth generation glass substrate, so is widely used as a channel layer of a TFT for liquid crystal panels. However, the mobility of electron carriers (carrier mobility) is a low 1 $cm^2$/Vsec or less, so application in TFT for high-definition panels is becoming more difficult. In other words, as the definition of liquid crystals increases, there is a need to use semiconductor thin film that has higher carrier mobility than the 1 $cm^2$/Vsec carrier mobility of amorphous silicon film in the channel layer.

On the other hand, polycrystalline silicon film has high carrier mobility of about 100 $cm^2$/Vsec, so has sufficient characteristics as channel layer material for a TFT for a high-definition panel. However, in polycrystalline film, the carrier mobility at the crystal boundary is reduced, so there are problems in that the uniformity in the surface of the substrate is poor, and there is variation in the TFT characteristics. Moreover, the production process for a polycrystalline film is such that after an amorphous silicon film is formed at a relatively low temperature of 300° C. or less, the film is crystallized by an annealing process. This annealing process is a special process that employs excimer laser annealing or the like, so a high running cost is necessary. In addition, the size of the glass substrate that can be used is fixed at a fifth generation substrate, so the cost reduction is limited, and thus product development is also limited.

Therefore, currently there is a need for a channel layer material that includes the best characteristics of both amorphous silicon film and polycrystalline silicon film, and that is also low cost.

In regard to this, JP 2010-182924 (A) discloses a transparent amorphous oxide thin film (a-IGZO film) that is formed by a vapor phase film formation method, and includes the elements In, Ga, Zn and O, where the composition of the oxide after crystallization is $InGaO_3(ZnO)_m$ (m is a natural number less than 6), and a thin film transistor in which this transparent semi-insulating amorphous oxide thin film is taken to be the channel layer. This transparent semi-insulating amorphous oxide thin film is capable of carrier mobility greater than 1 $cm^2$/Vsec, and a carrier density of $10^{16}$/$cm^3$ or less without adding impurity ions.

However, even though the a-IGZO film that is disclosed in JP 2010-182924 (A) and formed by a vapor phase film formation method such as a sputtering method or pulse laser vapor deposition method has relatively high carrier mobility in the range 1 to 10 $cm^2$/Vsec, in the amorphous oxide thin film oxide deficiencies inherently occur easily, and the behavior of the electron carriers is not always stable with respect to external factors such as heat, so there is a problem in that the operation of a device such as a TFT becomes unstable. Furthermore, it has been pointed out that when a negative bias is continuously applied to a TFT element under visible-light irradiation, a phenomenon, which is unique to amorphous film, occurs in that the threshold voltage shifts to the negative side (illumination negative bias degradation phenomenon), and this phenomenon becomes a serious problem in uses such as liquid-crystal displays.

On the other hand, JP 2008-192721 (A) or JP 2010-251606 (A) disclose applying an indium oxide film that is doped with tin, titanium or tungsten, or an indium oxide film that is doped with tungsten and zinc and/or tin for the channel layer with the object of obtaining a thin film transistor in which elements can be made on a polymeric substrate without requiring a high-temperature process, and that is capable of achieving high performance and high reliability at low cost. These technologies take advantage of the tendency to support an amorphous property and the heat stability or film flatness of indium oxide film that is doped with tungsten, or an indium oxide film that is doped with tungsten and zinc. These oxide thin films are obtained by sputtering film formation without heating the substrate, and since an annealing process is not performed after film formation, the film is amorphous film. As a result of applying these amorphous oxide thin films to the channel layer, the TFT element achieves carrier mobility of about 5 $cm^2$/Vsec. However, these amorphous oxide thin films also, while being amorphous films, have problems in that oxygen deficiencies occur easily, and are unstable with respect to external factors such as heat, and furthermore, have a problem in that the illumination negative bias degradation phenomenon, which is unique to amorphous film, occurs.

RELATED LITERATURE

Patent Literature

[Patent Literature 1] JP 2010-182924 (A)
[Patent Literature 2] JP 2008-192721 (A)
[Patent Literature 3] JP 2010-251606 (A)

SUMMARY OF INVENTION

Problem to be Solved by Invention

The object of the present invention is to provide an oxide semiconductor thin film using an oxide crystalline thin film that eliminates the problems of an oxide amorphous thin film as an oxide semiconductor thin film, comprises relatively high carrier mobility, and is suitable as channel layer material of a thin film transistor (TFT).

Means for Solving Problems

The inventors diligently investigated substitute materials for an oxide amorphous thin film that could be applied to an oxide semiconductor thin film. More specifically, experiments were performed by forming crystalline oxide semiconductor thin films by annealing amorphous oxide semiconductor thin films comprising as main components oxides of indium and tungsten, or oxides of indium, tungsten and zinc that were obtained by a sputtering method. When doing this, conditions for the crystallized oxide semiconductor thin film to achieve high carrier mobility, or in other words, the composition, film thickness and conditions of crystallization of indium and tungsten oxides, or indium, tungsten and zinc oxides as oxide semiconductor thin film were investigated in detail.

As a result, a technical knowledge is obtained that an oxide crystalline thin film that is obtained by:
(1) making the tungsten content in a W/In atomic ratio 0.005 to 0.1 in an oxide semiconductor thin film comprising oxides of indium and tungsten as main components, or making the tungsten content in a W/In atomic ratio 0.005 to 0.12 and the zinc content in a Z/In atomic ratio 0.001 to 0.05 in an oxide semiconductor thin film comprising oxides of indium, tungsten and zinc as main components;
(2) making either oxide semiconductor thin film a crystalline thin film that comprises only the $In_2O_3$ phase of bixbyite structure by performing an annealing process; and
(3) controlling the film thickness of either oxide semiconductor thin film to be within the range 15 to 200 nm;
has carrier mobility that is higher than 1 $cm^2$/Vsec, and a low carrier density of $10^{18}/cm^3$ or less, and is suitable for an oxide semiconductor thin film to be used as channel layer material of a thin film transistor (TFT).

In other words, the oxide semiconductor thin film of the present invention comprises an oxide that includes indium and tungsten, has a tungsten content in a W/In atomic ratio of 0.005 to 0.12, is crystalline, comprises only the $In_2O_3$ phase of bixbyite structure, has a carrier density of $1 \times 10^{18}$ $cm^{-3}$ or less, and has a carrier mobility of higher than 1 $cm^2$/Vsec.

Preferably, the tungsten content in the W/In atomic ratio is 0.01 to 0.05, and more preferably 0.015 to 0.035.

It is also possible to include zinc in the oxides of the oxide semiconductor thin film of the present invention. In other words, the oxide semiconductor thin film of the present invention can be formed using oxides that include indium, zinc and tungsten, and in this case, the tungsten content in a W/In atomic ratio is 0.005 to 0.12, the zinc content in a Zn/In atomic ratio is 0.05 or less, the oxide semiconductor thin film is crystalline and comprises only the $In_2O_3$ phase of bixbyite structure, the carrier density is $1 \times 10^{18}$ $cm^{-3}$ or less, and the carrier mobility is higher than 1 $cm^2$/Vsec.

In this oxide semiconductor thin film, preferably the tungsten content in the W/In atomic ratio is 0.01 to 0.05, and more preferably 0.015 to 0.035. Moreover, preferably the zinc content in the Zn/In atomic ratio is 0.003 to 0.03, and more preferably 0.005 to 0.02.

Preferably, the film thickness of the oxide semiconductor thin film of the present invention is 15 to 200 nm, and more preferably 30 to 150 nm, and even more preferably 40 to 100 nm.

In the oxide semiconductor thin film of the present invention, preferably the average crystal grain size is 10 nm or greater, and more preferably is 20 nm or greater.

In the oxide semiconductor thin film of the present invention, by suitably regulating at least the composition and film thickness in this way, it is possible to make the carrier mobility be 3 $cm^2$/Vsec or greater, and furthermore 10 $cm^2$/Vsec or greater. Moreover, it is also possible to make the carrier density $1 \times 10^{16}$ to $1 \times 10^{17}$ $cm^{-3}$.

The thin film transistor (TFT) of the present invention comprises a source electrode, a drain electrode, a gate electrode, a channel layer and a gate insulating layer, wherein the channel layer comprises the oxide semiconductor thin film of the present invention.

Effect of Invention

The oxide semiconductor thin film of the present invention is an oxide crystalline thin film, so has a high carrier mobility exceeding 1 $cm^2$/Vsec, is such that oxygen deficiencies do not easily occur, is stable against external factors such as heat, and there is no problem such as the occurrence of the illumination negative bias degradation phenomenon.

Moreover, the oxide semiconductor thin film of the present invention can be obtained by performing an annealing process on an oxide amorphous thin film having specified composition at a temperature of 400° C. or less, for example, to obtain an oxide crystalline thin film comprising only the $In_2O_3$ phase of bixbyite structure and having high crystallinity.

Therefore, by using the oxide semiconductor thin film of the present invention as channel layer material, it is possible to improve the TFT characteristics at low cost, so the present invention has very large industrial significance.

MODES FOR CARRYING OUT INVENTION

Figure 1:
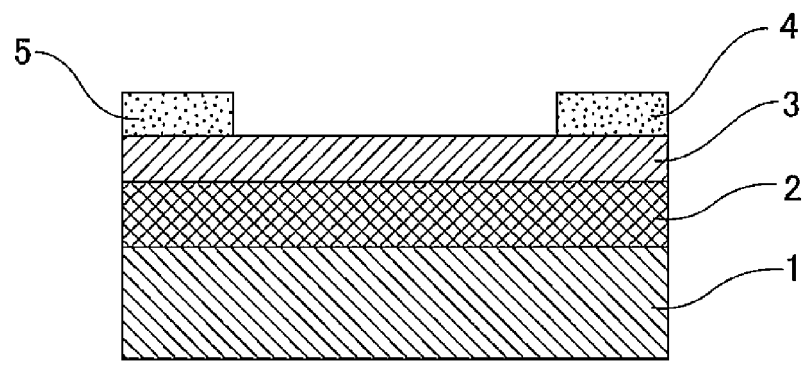
FIG. 1 is a cross-sectional view of a TFT element of an embodiment of the present invention.
Figure 2:
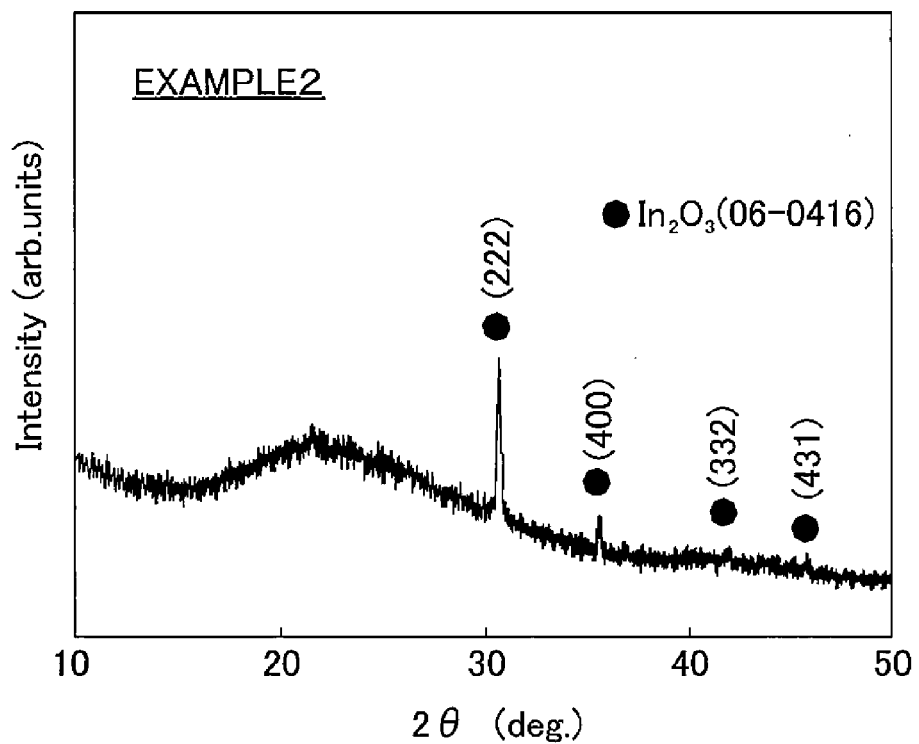
FIG. 2 is graph illustrating the results of performing X-ray diffraction measurement of an oxide semiconductor thin film of a second example of an embodiment of the present invention.

In the following, the oxide semiconductor thin film, and a thin film transistor (TFT) that uses the oxide semiconductor as channel layer material will be explained in detail.
1. Oxide Semiconductor Thin Film
(a) Composition The crystalline oxide semiconductor thin film of the present invention that has an oxide that includes indium and tungsten must be controlled so that the tungsten content in a W/In atomic is within the range 0.005 to 0.12, and preferably 0.01 to 0.05, and even more preferably 0.015 to 0.035.

The oxide semiconductor thin film that is applied to a TFT must be controlled so that the carrier density is $1 \times 10^{18}$ $cm^{-3}$ or less, and preferably within the range $1 \times 10^{16}$ $cm^{-3}$ to $1 \times 10^{17}$ $cm^{-3}$, however, by making the tungsten content in the W/In atomic ratio 0.005 or greater, it is possible to easily achieve this kind of carrier density. In order to stably control the carrier density to be within the range $1 \times 10^{16}$ $cm^{-3}$ to $1 \times 10^{17}$ $cm^{-3}$, preferably the tungsten content in the W/In atomic ratio is controlled to be 0.01 or greater, and preferably 0.015 or greater.

Moreover, the carrier sources of a crystalline oxide semiconductor thin film that includes only an indium oxide and does not include any other added elements are mainly oxygen deficiencies, however, it is thought that by adding tungsten, generation of oxygen deficiencies can be suppressed. On the other hand, tungsten inside a crystalline oxide semiconductor thin film becomes hexavalent ions or pentavalent ions, behaves as a so-called ion impurity scattering center, and becomes the cause of carrier scattering, so by adding tungsten, the carrier mobility decreases. More specifically, when the tungsten content in the W/In atomic ratio is greater than 0.12, carrier scattering become severe, and the carrier mobility becomes 1 $cm^2$/Vsec or less. In other words, in order to make the carrier mobility 1 $cm^2$/Vsec or greater, it is necessary that the tungsten content in the W/In atomic ratio be 0.12 or less. From the aspect of stably making the carrier mobility 10 $cm^2$/Vsec or greater, preferably the tungsten content in the W/In atomic ratio is 0.05 or less, and more preferably 0.035 or less.

Zinc can be included in the oxide of the oxide semiconductor thin film of the present invention. This oxide semiconductor thin film that comprises an oxide that includes indium, tungsten and zinc, for the same reasons as for an oxide semiconductor thin film that comprises an oxide that includes indium and tungsten, is regulated so that the tungsten content in the W/In atomic ratio is within the range 0.005 to 0.12, and preferably 0.01 to 0.05, and more preferably 0.015 to 0.035.

On the other hand, the zinc content in the Zn/In atomic ratio is regulated to be 0.05 or less. The zinc inside the oxide semiconductor thin film behaves as bivalence ions, so when replacing an In site in the crystalline $In_2O_3$ phase, holes are generated instead of electrons as the carrier. It is thought that holes will eliminate electrons that occur due to oxygen deficiencies by neutralizing. In other words, it is possible to reduce carrier density by adding zinc within the ranges above.

When the zinc content in the Zn/In atomic ratio is greater than 0.05, the crystallization temperature becomes high, so it becomes difficult to obtain a crystalline oxide semiconductor thin film, or even in the case that a crystalline oxide semiconductor thin film is obtained, the crystallinity is low. In order to stably obtain the effect of reducing carrier density, the zinc content in the Zn/In atomic ratio is preferably 0.003 to 0.03, and more preferably 0.005 to 0.02.

The oxide thin film of the present invention comprises, in addition to an oxide being composed of indium and tungsten, or indium, zinc and tungsten, with inevitable impurities, an oxide including indium and tungsten, or indium, zinc and tungsten as the main components, and known additional elements used depending on the usage of the oxide semiconductor thin film, with inevitable impurities. As such additional elements, it is possible to use for example, gallium, aluminum, chromium, iron, tantalum or the like. The content of these additional elements is such that when the number of atoms of the additional elements is taken to be M, the M/In atomic ratio is preferably 0.003 to 0.03, and more preferably 0.005 to 0.02. When the content of the additional elements in the M/In atomic ratio is less than 0.003, the effect of adding the elements cannot be obtained. On the other hand, when the M/In atomic ratio is greater than 0.03, it is not possible to obtain the desired characteristics for the relationship with the contents of indium, tungsten or zinc.

(b) Formation Phase and Structure

The oxide semiconductor thin film of the present invention is crystalline and practically comprises only the $In_2O_3$ phase of bixbyite structure. In the $In_2O_3$ phase of bixbyite structure, $InO_6$ octahedron structure that comprises In and O is formed, where adjacent $InO_6$ octahedron structures share an edge, and the In—In distance is short. Therefore, the overlapping of paths of electron carriers becomes large, and carrier mobility improves. Elements other than indium that include tungsten and zinc dissolve in the $In_2O_3$ phase of this bixbyite structure. Here, the fact that practically no crystal phases other than the $In_2O_3$ phase of the bixbyite structure are included means that, in addition to the phase that comprises only the $In_2O_3$ phase of the bixbyite structure, a small amount of phases other than the $In_2O_3$ phase that shares an edge with the $InO_6$ octahedron structure are also included in the oxide semiconductor thin film of the present invention as long as the characteristics of the oxide semiconductor thin film (carrier density and carrier mobility) are within the range of the present invention.

(c) Average Crystal Grain Size

Moreover, in the oxide semiconductor thin film of the present invention, the size of the crystal grains of the oxide semiconductor thin film, or in other words, the average crystal grain size is preferably 10 nm or greater, and more preferably 20 nm. By making an oxide semiconductor thin film having an average crystal grain size of 10 nm or greater, scattering of carriers at the crystal grain boundary decreases, so it becomes possible to stably improve the carrier mobility to 1 $cm^2$/Vsec or greater. The upper limit value for the average crystal grain size is not particularly limited, however, from the aspect of providing a uniform distribution at the crystal grain boundary that exists in the channel layer, preferably the upper limit is 1,000 nm or less. The average crystal grain size can be found, for example, from calculation from X-ray diffraction measurement results, or image analysis of SEM or EBSD observation images.

(d) Film Thickness

The film thickness of the oxide semiconductor thin film of the present invention is preferably controlled to be within the range 15 to 200 nm, and more preferably 30 to 150 nm, and even more preferably 40 to 100 nm.

Generally, semiconductor thin film is not limited to an oxide, and is often formed on a glass substrate. In other words, a crystalline substrate is formed on an amorphous substrate. Therefore, in the case of the oxide semiconductor thin film of the present invention, when the film thickness is less than 15 nm, depending on the amount of tungsten or zinc that is added, and even when an annealing process is performed at a high temperature of 400° C. due to the effect of the substrate, there are cases in which the oxide amorphous thin film precursor is not crystallized. There are also cases in which even though this oxide amorphous thin film is crystallized, sufficient crystallinity is not obtained. As a result, high carrier mobility cannot be obtained. Moreover, it is difficult to make the average crystal grain size of the obtained crystal film 10 nm or more.

The effect on the crystallinity of the oxide semiconductor thin film due to the substrate being amorphous can be further reduced by making the film thickness of the oxide semiconductor thin film 30 nm or greater; however, by making the thickness 40 nm or greater, it becomes possible to stably eliminate that effect. However, when taking cost into consideration, preferably the film thickness is 200 nm or less, and more preferably 150 nm or less, and even more preferably 100 nm or less. By controlling the film thickness to around 100 nm, it is expected that transmission of blue light can be improved through optical interference when the oxide semiconductor thin film of the present invention is formed on a glass substrate. Therefore, when applied to a transparent TFT, preferably the film thickness is adjusted to around 100 nm.

2. Production Method for Oxide Semiconductor Thin Film (a) Film Formation (a-1) Raw Materials The oxide semiconductor thin film of the present invention is formed on a substrate by known film-formation technology such as a sputtering method, ion plating method and the like that uses an oxide sintered compact target or tablet. When doing this, the metal element composition ratio of the oxide sintered compact raw material is the same as the metal composition ratio of the oxide semiconductor thin film of the present invention. In other words, in an oxide sintered compact that includes indium and tungsten, the content of tungsten in the W/In atomic ratio is 0.005 to 0.12, and preferably 0.01 to 0.05, and more preferably 0.015 to 0.035. Similarly, in an oxide sintered compact that comprises indium, tungsten and zinc, the tungsten content in the W/In atomic ratio is 0.005 to 0.12, and preferably 0.01 to 0.05, and more preferably 0.015 to 0.035, and the zinc content in the Zn/In atomic ratio is 0.05 or less, and preferably 0.003 to 0.03, and more preferably 0.005 to 0.02.

As an oxide sintered compact that comprises indium and tungsten, mainly an oxide sintered compact that comprises the $In_2O_3$ phase of bixbyite structure is used. Tungsten is dissolved in this $In_2O_3$ phase. However, there can also be a co-existing $In_2O_3$ phase in which tungsten is not dissolved, or in other words a co-existing $In_2O_3$ phase in which no elements are dissolved except for inevitable impurities. Moreover, it is also possible to use an oxide sintered compact in which a crystal phase other than $In_2O_3$ is dispersed in an indium oxide sintered compact as the material for the target or tablet, the other crystal phase being in a form of tungsten oxide such as $WO_3$, $WO_2$ and the like, or in a form of a compound oxide between an indium oxide and tungsten oxide such as $In_2W_3O_{12}$.

However, the area ratio of the other crystal phase with respect to the $In_2O_3$ phase must be 10% or less. For example, in a normal direct current (DC) sputtering method, the direct current power that is applied is increased in order to improve the speed of film formation. When doing this, when the area ratio is greater than 10%, it is possible that as sputtering advances, a crystal phase other than the $In_2O_3$ phase will become the starting point of nodule growth. On the other hand, when the area ratio of a crystal phase other than the $In_2O_3$ phase is controlled to be 10% or less, the crystal phase other than the $In_2O_3$ phase is dispersed finely, and the structure is such that nodule growth does not easily occur. By using this kind of oxide sintered compact as the material of the target or tablet, the occurrence of nodules is suppressed even when the direct current power that is applied during film formation is increased, and it becomes difficult for abnormal electric discharge to occur such as arcing, so it is possible to improve the efficiency of film formation.

An oxide sintered compact that comprises indium, zinc and tungsten also mainly comprises the $In_2O_3$ phase of the bixbyite structure. Tungsten and/or zinc are dissolved in the $In_2O_3$ phase, however, it is also possible that an $In_2O_3$ phase in which tungsten and zinc are not dissolved, or in other words, an $In_2O_3$ phase in which no elements are dissolved except for inevitable impurities to exist in the $In_2O_3$ phase. As in the case of an oxide sintered compact that comprises indium and tungsten, it is also possible to uses an oxide sintered compact as the phase other than the $In_2O_3$ phase in a form of tungsten oxide such as $WO_3$, $WO_2$ and the like, or a compound oxide between indium oxide and tungsten oxide such as $In_2W_3O_{12}$, the crystal phase other than the $In_2O_3$ phase being dispersed with an area ratio of 10% or less.

However, preferably no hexagonal crystal layered compound $In_2O_3(ZnO)_m$ (m=2 to 20) is formed. When such a compound phase is formed, the crystallization temperature rises considerably, and in an annealing process at about 400° C., it is difficult to improve crystallization or the crystallinity.

Even when another crystal phase in the form of a tungsten oxide such as $WO_3$ and $WO_2$ or in the form of a compound oxide between indium oxide and tungsten oxide such as $In_2W_3O_{12}$ is included as a crystal phase other than the $In_2O_3$ phase in an oxide sintered compact comprising indium and tungsten, or an oxide sintered compact comprising indium, zinc and tungsten, an oxide semiconductor thin film that is obtained by film formation by a sputtering method or ion plating method using these oxide sintered compacts as targets or tablets comprises only the $In_2O_3$ phase, and the tungsten and zinc are dissolved into the $In_2O_3$ phase.

(a-2) Film Formation Conditions

The oxide semiconductor thin film of the present invention can be formed by using a normal sputtering method or ion plating method, and in conditions that are normally applied in these methods. When the oxide semiconductor thin film of the present invention is formed on a substrate by a sputtering method, especially in the case of a direct-current sputtering method, the effect of heat during film formation is small, and film can be formed at high speed, so it is industrially advantageous.

A glass substrate is representative of a substrate, however, any substrate that is for a semiconductor device such as silicon can also be used, and in addition to that, as long as it is possible to withstand the temperature of the process above, it is also possible to use a resin substrate or resin film as the substrate.

The substrate temperature is preferably equal to or less than the crystallization temperature of the amorphous film comprising an oxide that includes indium and tungsten, or an oxide that includes indium, zinc and tungsten. When the substrate temperature is equal to or more than the crystallization temperature, these oxides crystallize during film formation, so elimination of oxygen deficiencies in the annealing process after that does not proceed, and as a result, it may become difficult to control the carrier density so as to be $1 \times 10^{18}$ cm$^{-3}$ or less. From this aspect, the substrate temperature is preferably 200° C. or less when the film thickness is in the range 15 to 70 nm, and 100° C. or less when the film thickness is in the range 70 to 20 nm. In either case, the temperature is preferably in the range from room temperature to 100° C.

The other film formation conditions are not particularly limited, and must be appropriately selected according to the film formation method and film formation apparatus. For example, when the oxide semiconductor thin film of the present invention is formed using a direct-current sputtering method, the air inside of the chamber of the sputtering apparatus is evacuated to $2 \times 10^{-4}$ Pa or less, after which the chamber is filled with sputtering gas until the gas pressure is 0.1 to 1 Pa, or preferably 0.2 to 0.8 Pa, or even more preferably 0.2 to 0.5 Pa. The sputtering gas used is preferably a mixed gas comprising an inert gas and oxygen, and particularly argon and oxygen. After that, the distance between the target and the substrate is adjusted to 10 to 100 mm, and preferably 40 to 70 mm, and furthermore, direct-current power is applied so that direct-current power with respect to the surface area of the target, or in other words, the direct-current power density is within the range 1 to 3 W/cm$^2$, which generates direct-current plasma, and after pre-sputtering has been performed for 5 to 30 minutes, the substrate position is corrected as necessary, and preferably sputtering is performed under the same condition.

(b) Crystallization

As the method for obtaining a crystalline oxide semiconductor thin film, there is a method in which the substrate temperature is controlled to be within the range from room temperature to 150° C., and an amorphous film is formed, after which an annealing process is performed on this amorphous film at the crystallization temperature or greater to cause crystallization, or there is a method of obtaining a crystalline oxide semiconductor thin film in which the substrate is heated to the crystallization temperature of the oxide semiconductor thin film or higher to form a film. In the present invention, it is possible to employ either method, however, when taking into consideration the effective elimination of oxygen deficiencies by the annealing process, or the ease of fine processing by wet etching or the like that will be described later, obtaining a crystalline oxide semiconductor thin film by the former method is preferred. With the present invention, when employing either method, it is possible to make the heating temperature in the annealing process 400° C. or less.

In the case of the annealing process in order to crystallize the oxide semiconductor thin film of the present invention, the heating temperature is 250° C. or greater, and preferably 300° C. or greater, and even more preferably 350° C. or greater. In regards to the means for the annealing process, in addition to using an annealing furnace, it is possible to widely use known means for annealing, and to apply annealing conditions that include the annealing temperature according to the respective means.

(c) Fine Processing

The oxide semiconductor thin film of the present invention can undergo fine processing by wet etching or dry etching that is necessary for uses such as TFT or the like. In the case of a method in which first an amorphous film is formed, and after which heat treatment is performed at a temperature equal to or greater than the crystallization temperature, and the oxide semiconductor thin film is crystallized, it is possible to perform processing by wet etching that uses a weak acid after formation of the amorphous film. As long as the acid is a weak acid, most any acid can be used, however, preferably the weak acid has oxalic acid as the main component. For example, it is possible to use transparent conductive film etching fluid (ITO-06N) manufactured by Kanto Chemical Co., Ltd. In the case of dry etching, it is also possible to perform processing using a suitable etching gas on an oxide semiconductor thin film after crystallization, or on a crystalline oxide semiconductor thin film that is formed directly on the substrate during film formation.

3. TFT Element and Production Method Thereof

The thin film transistor (TFT) of the present invention, as described above, is characterized by using an oxide semiconductor thin film that comprises an oxide that includes indium and tungsten, or an oxide semiconductor thin film that comprises an oxide that includes indium, zinc and tungsten. The structure of the TFT is not limited, however, for example, it is possible to use structure of a TFT element as illustrated in FIG. 1.

The TFT element illustrated in FIG. 1 comprises a $SiO_2$/Si substrate that has a $SiO_2$ film that was formed on the surface of Si substrate by thermal oxidation, and the oxide semiconductor thin film of the present invention, and Au/Ti layered electrodes which are formed on the substrate. In this construction, the gate electrode 1, the gate insulating layer 2, the channel layer 3, and the source electrode 4 and drain electrode 5 are respectively constructed by the Si substrate, the $SiO_2$ film, the oxide semiconductor thin film of the present invention, and the Au/Ti layered electrodes.

In the TFT element in FIG. 1, a $SiO_2$/Si substrate was used, however, the substrate is not limited to this, and it is also possible to use a substrate that has been used as the substrate for electronic devices including thin-film transistors. For example, in addition to a $SiO_2$/Si substrate or Si substrate, it is also possible to use a glass substrate such as non-alkali glass or quartz glass. Moreover, it is also possible to use various kinds of metal substrates or plastic substrates, or a heat-resistant non-transparent polymer substrate such as a polyimide, and the like.

The gate electrode 1 is made using a Si substrate in the TFT element illustrated in FIG. 1, however, it is also possible to use metal film such as Mo, Al, Ti, Au, Pt and the like, thin film that is a conductive oxide, nitride or oxide nitride of these metals, or various kinds of conductive high polymers. In the case of a transparent TFT, it is possible to use a transparent conductive film such as indium tin oxide (ITO). It is also possible to use an oxide semiconductor thin film that has the same metal element composition as the oxide semiconductor thin film of the present invention as a transparent conductive film. There is a need for this gate electrode 1 to have good electrical conductivity. The specific resistance of these electrodes is preferably controlled to be within the range $1\times10^{-6}$ to $1\times10^{-1}$ Ω·cm, and more preferably controlled to be within the range $1\times10^{-6}$ to $1\times10^{-3}$ Ω·cm.

Moreover, for the gate insulating layer 2 it is possible to use a known material such as a metal oxide thin film such as $SiO_2$, $Y_2O_3$, $Ta_2O_5$, Hf oxide and the like, a metal nitride film such as $SiN_y$, or insulating high polymer material such as a polyimide. The specific resistance of the gate insulating layer 2 is preferably controlled to be within the range $1\times10^6$ to $1\times10^{15}$ Ω·cm, and more preferably $1\times10^{10}$ to $1\times10^{15}$ Ω·cm.

The specific resistance of the channel layer 3 is not particularly limited, however, preferably is controlled to be $1\times10^{-1}$ to $1\times10^6$ Ω·cm, and more preferably is controlled to be $1\times10^0$ to $1\times10^3$ Ω·cm. The specific resistance of the oxide semiconductor thin film of the present invention can be controlled relatively easily because it is possible to adjust the amount oxygen deficiencies generated by selecting film formation conditions for the sputtering method or ion plating method, and by selecting conditions for the crystallization annealing process.

As in the case of the gate electrode 1, as the source electrode 4 and drain electrode 5, it is possible to use thin film of metals such as Mo, Al, Ti, Au, Pt and the like, conductive oxide or nitride thin film of those metals, or various kinds of conductive high polymers, or transparent conductive film such as ITO for a transparent TFT. The source electrode 4 and drain electrode 5 need to have good electrical conductivity. The specific resistance of these electrodes is preferably controlled to be within the range $10^{-6}$ to $10^{-1}$ Ω·cm, and more preferably controlled to be within the range $10^{-6}$ to $10^{-3}$ Ω·cm.

The construction of the TFT element that is produced by the production method of the present invention is not limited to the bottom-gate top-contact type element that is illustrated in FIG. 1, and it is possible to select other types such as bottom-gate bottom-contact, top-gate bottom-contact, top-gate top-contact and the like.

EXAMPLES

In the following, the present invention will be explained in further detail using examples, however, the present invention is not limited to these examples. The oxide sintered compact, oxide semiconductor thin film and TFT element are evaluated by the methods described below.

[Evaluation of Oxide Sintered Compact]

Powder X-ray diffraction was performed on end materials of the oxide sintered compacts that were obtained in each of the examples and comparison examples using an X-ray diffractometer (X' PertPRO MPD, manufactured by Philips), and the generated phases were identified.

[Characteristic Evaluation of Oxide Semiconductor Thin Film]

The composition of the oxide sintered compacts that were obtained in each of the examples and comparison examples was measured using ICP-atomic emission spectrometry. Moreover, the film thickness of the oxide semiconductor thin film was measured using a profilometer (manufactured by KLA-Tencor Corp.), and the speed of film formation was calculated from the results and film formation time. Furthermore, the carrier density and specific resistance of the oxide semiconductor thin film were measured using a Hall effect measurement apparatus (manufactured by Toyo Corp.), and the carrier mobility was calculated from these values. The generated phases of the oxide semiconductor thin film was performed in the same way as described above using X-ray diffraction measurement.

[Characteristic Evaluation of TFT Element]

Characteristic evaluation of the TFT element was performed by using a semiconductor parameter analyzer (4200SCS, manufactured by Keithley Instruments) to confirm the TFT element operation and to measure the on/off ratio and the electron field-effect mobility. Here, the on/off ratio is the ratio of the resistance in the off state with respect to that in the on state.

Examples 1 to 12, Comparative Examples 1 and 2

Example 1

An oxide sintered compact that includes indium and tungsten as oxides (oxide sintered compact target) was prepared as the sputtering target. This oxide sintered compact was such that the tungsten content in the W/In atomic ratio was 0.035, and comprised only the $In_2O_3$ phase.

The sputtering target was attached to a cathode for a non-magnetic target of a direct-current magnetron sputtering apparatus (manufactured by Canon Tokki Co., Ltd.) that was equipped with a direct-current power source having no generation arcing suppression function. A non-alkali glass substrate (Corning #7059, manufactured by Corning Incorporated) was used for the substrate, and the distance between the target and the substrate was set to be 60 mm. After that, air was evacuated to $2 \times 10^{-4}$ Pa or less, after which a gas mixture comprising argon and oxygen was introduced until the percentage of oxygen was 6.0%, and the gas pressure was adjusted to be 0.6 Pa.

Under these conditions, an oxide semiconductor thin film was formed by applying direct-current power of 300 W (1.6 W/cm$^2$) and generating direct-current plasma. More specifically, after performing pre-sputtering for 10 minutes, a substrate was placed directly above the sputtering target, or in other words in a stationary opposing position, and sputtering was further performed at room temperature without heating to form a 50 nm thick oxide semiconductor thin film. The composition of this oxide semiconductor thin film was confirmed to be mostly the same as the composition of the oxide sintered compact target. Moreover, as a result of X-ray diffraction measurement, it was confirmed that this oxide semiconductor thin film was amorphous.

This oxide semiconductor thin film was annealed for 30 minutes in an air atmosphere at 400° C. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite structure. After that, the average crystal grain size was calculated from the $In_2O_3$ (222) peak and found to be 50 nm.

Next, Hall effect measurement of the oxide semiconductor thin film was performed, and the carrier density was found to be $5.4 \times 10^{16}$ cm$^{-3}$, and the carrier mobility was found to be 17.4 cm$^2$/Vsec.

Example 2

An amorphous oxide semiconductor thin film that was obtained in the same way as in Example 1 was annealed for 30 minutes in an air atmosphere at 300° C. After annealing, the oxide semiconductor thin film was crystallized, and $In_2O_3$ (222) was taken to be the main peak. The average crystal grain size of the oxide semiconductor thin film was 58 nm, the carrier density was $2.1 \times 10^{17}$ cm$^{-3}$, and the carrier mobility was 9.2 cm$^2$/Vsec.

Example 3

Except for changing the tungsten content in the W/In atomic ratio in the oxide sintered compact target to be 0.02, the conditions were not changed, and an oxide semiconductor thin film was formed using the same sputtering film formation conditions as in Example 1. The composition of this oxide semiconductor thin film was mostly the same as the composition of the oxide sintered compact target, and was amorphous.

This oxide semiconductor thin film was annealed for 30 minutes in an air atmosphere at 400° C. After annealing, the oxide semiconductor thin film was crystallized, and $In_2O_3$ (222) was taken to be the main peak. The average crystal grain size of this oxide semiconductor thin film was 51 nm, the carrier density was $5.9 \times 10^{16}$ cm$^{-3}$, and the carrier mobility was 22.8 cm$^2$/Vsec.

Example 4

Except for changing the tungsten content in the W/In atomic ratio in the oxide sintered compact target to be 0.015, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 50 nm, the carrier density was $7.8 \times 10^{16}$ cm$^{-3}$, and the carrier mobility was 20.2 cm$^2$/Vsec.

Example 5

An amorphous oxide semiconductor thin film that was obtained in the same way as in Example 4 was annealed for 30 minutes in an air atmosphere at 300° C. After annealing, the oxide semiconductor thin film was crystallized, and $In_2O_3$ (222) was taken to be the main peak. The average crystal grain size of this oxide semiconductor thin film was 59 nm, the carrier density was $1.6 \times 10^{17}$ cm$^{-3}$, and the carrier mobility was 8.7 cm$^2$/Vsec.

Example 6

Except for changing the tungsten content in the W/In atomic ratio in the oxide sintered compact target to be 0.01, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 55 nm, the carrier density was $9.7 \times 10^{16}$ cm$^{-3}$, and the carrier mobility was 11.2 cm$^2$/Vsec.

Example 7

Except for changing the tungsten content in the W/In atomic ratio in the oxide sintered compact target to be 0.05, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystalline, and $In_2O_3$ (222) was taken to be the main peak. The average crystal grain size of this oxide semiconductor thin film was 55 nm, the carrier density was $4.9 \times 10^{16}$ cm$^{-3}$, and the carrier mobility was 10.4 cm$^2$/Vsec.

Example 8

Except for changing the tungsten content in the W/In atomic ratio in the oxide sintered compact target to be 0.005, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystalline, and $In_2O_3$ (222) was taken to be the main peak. The average crystal grain size of this oxide semiconductor thin film was 53 nm, the carrier density was $1.3 \times 10^{17}$ cm$^{-3}$, and the carrier mobility was 8.1 cm$^2$/Vsec.

Example 9

Except for changing the tungsten content in the W/In atomic ratio in the oxide sintered compact target to be 0.07, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystalline, and $In_2O_3$ (222) was taken to be the main peak. The average crystal grain size of this oxide semiconductor thin film was 56 nm, the carrier density was $4.0 \times 10^{16}$ cm$^{-3}$, and the carrier mobility was 8.5 cm$^2$/Vsec.

Example 10

Except for changing the tungsten content in the W/In atomic ratio in the oxide sintered compact target to be 0.12, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystalline, and $In_2O_3$ (222) was taken to be the main peak. The average crystal grain size of this oxide semiconductor thin film was 55 nm, the carrier density was $4.8 \times 10^{16}$ cm$^{-3}$, and the carrier mobility was 3.9 cm$^2$/Vsec.

Example 11

Except for changing the film thickness of the oxide semiconductor thin film to be 15 nm, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystalline, and $In_2O_3$ (222) was taken to be the main peak. The average crystal grain size of this oxide semiconductor thin film was 10 nm, the carrier density was $9.6 \times 10^{16}$ cm$^{-3}$, and the carrier mobility was 13.2 cm$^2$/Vsec.

Example 12

Except for changing the film thickness of the oxide semiconductor thin film to be 200 nm, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystalline, and $In_2O_3$ (222) was taken to be the main peak. The average crystal grain size of this oxide semiconductor thin film was 62 nm, the carrier density was $5.0 \times 10^{16}$ cm$^{-3}$, and the carrier mobility was 18.8 cm$^2$/Vsec.

Comparative Example 1

Except for changing the tungsten content in the W/In atomic ratio in the oxide sintered compact target to be 0.001, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystalline, and $In_2O_3$ (222) was taken to be the main peak. The average crystal grain size of this oxide semiconductor thin film was 53 nm, the carrier density was $2.3 \times 10^{18}$ cm$^{-3}$, and the carrier mobility was 7.6 cm$^2$/Vsec.

Comparative Example 2

Except for changing the tungsten content in the W/In atomic ratio in the oxide sintered compact target to be 0.2, the conditions were not changed, and an oxide semiconductor thin film was formed using the same sputtering film formation conditions and annealing conditions as in Example 1. The oxide semiconductor thin film after film formation had mostly the same composition as the oxide sintered compact target, and was amorphous. Moreover, after annealing, the oxide semiconductor thin film was crystalline, and $In_2O_3$ (222) was taken to be the main peak. The average crystal grain size of this oxide semiconductor thin film was 55 nm, the carrier density was $3.5 \times 10^{16}$ cm$^{-3}$, and the carrier mobility was 0.8 cm$^2$/Vsec.

TABLE 1

| | W/In | M/In | Annealing temperature (° C.) | Film thickness (nm) | Average crystal grain size (nm) | Carrier density ($\times 10^{16}$ cm$^{-3}$) | Carrier mobility (cm$^2$/Vsec) |
|---|---|---|---|---|---|---|---|
| Ex-1 | 0.035 | — | 400 | 50 | 50 | 5.4 | 17.4 |
| Ex-2 | 0.035 | — | 300 | 50 | 58 | 21 | 9.2 |
| Ex-3 | 0.02 | — | 400 | 50 | 51 | 5.9 | 22.8 |
| Ex-4 | 0.015 | — | 400 | 50 | 50 | 7.8 | 20.2 |
| Ex-5 | 0.015 | — | 300 | 50 | 59 | 16 | 8.7 |
| Ex-6 | 0.01 | — | 400 | 50 | 55 | 9.7 | 11.2 |
| Ex-7 | 0.05 | — | 400 | 50 | 55 | 4.9 | 10.4 |
| Ex-8 | 0.005 | — | 400 | 50 | 53 | 13 | 8.1 |
| Ex-9 | 0.07 | — | 400 | 50 | 56 | 4.0 | 8.5 |
| Ex-10 | 0.12 | — | 400 | 50 | 55 | 4.8 | 3.9 |
| Ex-11 | 0.035 | — | 400 | 15 | 10 | 9.6 | 13.2 |
| Ex-12 | 0.035 | — | 400 | 200 | 62 | 5.0 | 18.8 |
| Cx-1 | 0.001 | — | 400 | 50 | 53 | 230 | 7.6 |
| Cx-2 | 0.2 | — | 400 | 50 | 55 | 3.5 | 0.8 |

(Ex = Example, Cx = Camparative Example)

From Examples 1 to 12, it can be understood that by controlling the tungsten content in the W/In atomic ratio to be 0.005 to 0.12, and by performing an annealing process in an air atmosphere at 400° C. or less, the oxide semiconductor thin film becomes crystalline, and it is possible to make the carrier density $1 \times 10^{18}$ cm$^{-3}$ or less, and make the carrier mobility higher than 1 cm$^2$/Vsec.

Particularly, from Examples 1, 3 and 4, it is understood that by controlling the tungsten content in the W/In atomic ratio to be 0.015 to 0.035, and by performing an annealing process in an air atmosphere at 400° C., it is possible to make the carrier density of the oxide semiconductor thin film $1 \times 10^{16}$ cm$^{-3}$ to $1 \times 10^{17}$ cm$^{-3}$, and make the carrier mobility 15 cm$^2$/Vsec or greater.

Moreover, from Examples 6 and 7, it is understood that by controlling the tungsten content in the W/In atomic ratio to be 0.01 to 0.05, and by performing an annealing process in an air atmosphere at 400° C., it is possible to make the carrier density of the oxide semiconductor thin film $1 \times 10^{16}$ cm$^{-3}$ to $1 \times 10^{17}$ cm$^{-3}$, and make the carrier mobility 10 cm$^2$/Vsec or greater.

On the other hand, Examples 11 and 12 are examples of cases in which the film thickness of the oxide semiconductor thin film is 15 nm and 200 nm. In these cases as well, it is understood that by performing an annealing process under specified conditions, it is possible to make the average crystal grain size 10 nm or greater, as well as make the carrier density within the range $1 \times 10^{16}$ cm$^{-3}$ to $1 \times 10^{17}$ cm$^{-3}$, and make the carrier mobility 10 cm$^2$/Vsec or greater.

In regard to this, Comparative Examples 1 and 2 are examples in which the tungsten content is not within the range of the present invention. Comparative Example 1 is an example in which the tungsten content in the W/In atomic ratio is less than 0.005; and in this case, it is understood that the carrier density is greater than $1 \times 10^{18}$ cm$^{-3}$. Moreover, Comparative Example 2 is an example in which the tungsten content in the W/In atomic ratio is greater than 0.12; and in this case, it is understood that the carrier mobility is less than 1 cm$^2$/Vsec.

Examples 13 to 24, Comparative Examples 3 and 4

Example 13

Except for using a sputtering target that comprises an oxide sintered compact that includes indium, zinc and tungsten as oxides with the tungsten content in the W/In atomic ratio being 0.035, and the zinc content in the Z/In atomic ratio being 0.01, and that comprises only the In$_2$O$_3$ phase, an oxide semiconductor thin film was formed under the same sputtering film formation conditions and annealing condition as in Example 1. The oxide semiconductor thin film after film formation had mostly the same composition as the oxide sintered compact target, and was amorphous. Moreover, after annealing, the oxide semiconductor thin film was crystallized, and In$_2$O$_3$ (222) was taken to be the main peak. The average crystal grain size of this oxide semiconductor thin film was 53 nm, the carrier density was $4.1 \times 10^{16}$ cm$^{-3}$, and the carrier mobility was 16.1 cm$^2$/Vsec.

Example 14

An amorphous oxide semiconductor thin film that was obtained in the same way as in Example 13 was annealed for 30 minutes in an air atmosphere at 300° C. to obtain a crystalline oxide semiconductor thin film. As a result of X-ray diffraction measurement, after annealing, the oxide semiconductor thin film was crystallized, and In$_2$O$_3$ (222) was taken to be the main peak. The average crystal grain size of this oxide semiconductor thin film was 57 nm, the carrier density was $1.3 \times 10^{17}$ cm$^{-3}$, and the carrier mobility was 11.5 cm$^2$/Vsec.

Example 15

Except for changing the tungsten content in the W/In atomic ratio in the oxide sintered compact target to be 0.015, and the zinc content in the Zn/In atomic ratio to be 0.005, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. Moreover, after annealing, the oxide semiconductor thin film was crystallized, and In$_2$O$_3$ (222) was taken to be the main peak. The average crystal grain size of this oxide semiconductor thin film was 50 nm, the carrier density was $6.2 \times 10^{16}$ cm$^{-3}$, and the carrier mobility was 19.1 cm$^2$/Vsec.

Example 16

An amorphous oxide semiconductor thin film that was obtained in the same way as in Example 15 was annealed for 30 minutes in an air atmosphere at 300° C. to obtain a crystalline oxide semiconductor thin film. As a result of X-ray diffraction measurement, after annealing, the oxide semiconductor thin film was crystallized, and $In_2O_3$ (222) was taken to be the main peak. The average crystal grain size of this oxide semiconductor thin film was 55 nm, the carrier density was $1.1\times10^{17}$ cm$^{-3}$, and the carrier mobility was 12.4 cm$^2$/Vsec.

Example 17

Except for changing the tungsten content in the W/In atomic ratio in the oxide sintered compact target to be 0.015, and the zinc content in the Zn/In atomic ratio to be 0.02, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 51 nm, the carrier density was $5.4\times10^{16}$ cm$^{-3}$, and the carrier mobility was 16.0 cm$^2$/Vsec.

Example 18

Except for changing the tungsten content in the W/In atomic ratio in the oxide sintered compact target to be 0.02, and the zinc content in the Zn/In atomic ratio to be 0.01, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 54 nm, the carrier density was $5.2\times10^{16}$ cm$^{-3}$, and the carrier mobility was 21.1 cm$^2$/Vsec.

Example 19

Except for changing the tungsten content in the W/In atomic ratio in the oxide sintered compact target to be 0.01, and the zinc content in the Zn/In atomic ratio to be 0.003, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 54 nm, the carrier density was $8.2\times10^{16}$ cm$^{-3}$, and the carrier mobility was 13.3 cm$^2$/Vsec.

Example 20

Except for changing the tungsten content in the W/In atomic ratio in the oxide sintered compact target to be 0.05, and the zinc content in the Zn/In atomic ratio to be 0.03, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 55 nm, the carrier density was $3.4\times10^{16}$ cm$^{-3}$, and the carrier mobility was 12.0 cm$^2$/Vsec.

Example 21

Except for changing the tungsten content in the W/In atomic ratio in the oxide sintered compact target to be 0.005, and the zinc content in the Zn/In atomic ratio to be 0.001, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 53 nm, the carrier density was $1.2\times10^{17}$ cm$^{-3}$, and the carrier mobility was 8.4 cm$^2$/Vsec.

Example 22

Except for changing the tungsten content in the W/In atomic ratio in the oxide sintered compact target to be 0.07, and the zinc content in the Zn/In atomic ratio to be 0.05, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 56 nm, the carrier density was $2.7\times10^{16}$ cm$^{-3}$, and the carrier mobility was 8.8 cm$^2$/Vsec.

Example 23

Except for changing the tungsten content in the W/In atomic ratio in the oxide sintered compact target to be 0.12, and the zinc content in the Zn/In atomic ratio to be 0.02, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 55 nm, the carrier density was $3.1\times10^{16}$ cm$^{-3}$, and the carrier mobility was 3.0 cm$^2$/Vsec.

Example 24

Except for changing the film thickness of the oxide semiconductor thin film to be 15 nm, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. Moreover, after annealing, the oxide semiconductor thin film was crystallized, and $In_2O_3$ (222) was taken to be the main peak. The average crystal grain size of this oxide semiconductor thin film was 11 nm, the carrier density was $4.1 \times 10^{16}$ cm$^{-3}$, and the carrier mobility was 11.8 cm$^2$/Vsec.

Comparative Example 3

Except for changing the tungsten content in the W/In atomic ratio in the oxide sintered compact target to be 0.035, and the zinc content in the Zn/In atomic ratio to be 0.08, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. As a result of X-ray diffraction measurement after the annealing process, it was confirmed that the oxide semiconductor thin film was not crystallized. Therefore, Hall effect measurement was not performed for the oxide semiconductor thin film.

Comparative Example 4

Except for changing the tungsten content in the W/In atomic ratio in the oxide sintered compact target to be 0.11, and the zinc content in the Zn/In atomic ratio to be 0.08, the conditions were not changed, and an oxide semiconductor thin film was formed using the same sputtering film formation conditions and annealing conditions as in Example 13. The oxide semiconductor thin film after film formation had mostly the same composition as the oxide sintered compact target, and was amorphous. As a result of X-ray diffraction measurement after the annealing process, it was confirmed that the oxide semiconductor thin film was not crystallized. Therefore, Hall effect measurement was not performed for the oxide semiconductor thin film.

sible to make the carrier density $1 \times 10^{18}$ cm$^{-3}$ or less, and make the carrier mobility higher than 1 cm$^2$/Vsec.

Particularly, from Examples 13, 15, 17 and 18, it is understood that by controlling the tungsten content in the W/In atomic ratio to be 0.015 to 0.035, by controlling the zinc content in the Zn/In atomic ratio to be 0.005 to 0.02, and by performing an annealing process in an air atmosphere at 400° C., it is possible to make the carrier density of the oxide semiconductor thin film $1 \times 10^{16}$ cm$^{-3}$ to $1 \times 10^{17}$ cm$^{-3}$, and make the carrier mobility 15 cm$^2$/Vsec or greater.

Moreover, from Examples 19 and 20, it is understood that by controlling the tungsten content in the W/In atomic ratio to be 0.01 to 0.05, by controlling the zinc content in the Zn/In atomic ratio to be 0.003 to 0.03, and by performing an annealing process in an air atmosphere at 400° C., it is possible to make the carrier density of the oxide semiconductor thin film $1 \times 10^{16}$ cm$^{-3}$ to $1 \times 10^{17}$ cm$^{-3}$, and make the carrier mobility 10 cm$^2$/Vsec or greater.

On the other hand, Example 24 is an example of a case in which the film thickness of the oxide semiconductor thin film is 15 nm when the W/In atomic ratio of the amount of tungsten included is 0.005 to 0.12, and the Zn/In atomic ratio of the amount of zinc included is 0.001 to 0.05. In this case as well, it is understood that by performing an annealing process under specified conditions, it is possible to make the average crystal grain size 10 nm or greater, as well as make the carrier density within the range $1 \times 10^{16}$ cm$^{-3}$ to $1 \times 10^{17}$ cm$^{-3}$, and make the carrier mobility 10 cm$^2$/Vsec or greater.

In regard to this, Comparative Examples 3 and 4 are examples in which the zinc content in the Zn/In atomic ratio is greater than 0.05, and in this case, it is understood that a crystalline oxide semiconductor thin film cannot be obtained.

Examples 25 and 26

Example 25

Film formation of an oxide semiconductor thin film was performed using a sputtering target comprising an oxide sintered compact that includes indium and tungsten as oxides

TABLE 2

| | W/In | Zn/In | Annealing temperature (° C.) | Film thickness (nm) | Average crystal grain size (nm) | Carrier density ($\times 10^{16}$ cm$^{-3}$) | Carrier mobility (cm$^2$/Vsec) |
|---|---|---|---|---|---|---|---|
| Ex-13 | 0.035 | 0.01 | 400 | 50 | 53 | 4.1 | 16.1 |
| Ex-14 | 0.035 | 0.01 | 300 | 50 | 57 | 13 | 11.5 |
| Ex-15 | 0.015 | 0.005 | 400 | 50 | 50 | 6.2 | 19.1 |
| Ex-16 | 0.015 | 0.005 | 300 | 50 | 55 | 11 | 12.4 |
| Ex-17 | 0.015 | 0.02 | 400 | 50 | 51 | 5.4 | 16.0 |
| Ex-18 | 0.02 | 0.01 | 400 | 50 | 54 | 5.2 | 21.1 |
| Ex-19 | 0.01 | 0.003 | 400 | 50 | 54 | 8.2 | 13.3 |
| Ex-20 | 0.05 | 0.03 | 400 | 50 | 55 | 3.4 | 12.0 |
| Ex-21 | 0.005 | 0.001 | 400 | 50 | 53 | 12 | 8.4 |
| Ex-22 | 0.07 | 0.05 | 400 | 50 | 56 | 2.7 | 8.8 |
| Ex-23 | 0.12 | 0.02 | 400 | 50 | 55 | 3.1 | 3.0 |
| Ex-24 | 0.035 | 0.01 | 400 | 15 | 11 | 4.1 | 11.8 |
| Cx-3 | 0.035 | 0.08 | 400 | 50 | — | — | — |
| Cx-4 | 0.11 | 0.08 | 400 | 50 | — | — | — |

(Ex = Example, Cx = Camparative Example)

From Examples 13 to 24, it can be understood that by controlling the tungsten content in the W/In atomic ratio to be 0.005 to 0.12, by controlling the zinc content in the Zn/In atomic ratio to be 0.001 to 0.05, and by performing an annealing process in an air atmosphere at 400° C. or less, the oxide semiconductor thin film becomes crystalline, and it is posand was performed on a $SiO_2$ film having a thickness of 300 nm which was formed on a Si substrate by thermal oxidation so that the thickness of the oxide semiconductor thin film became 50 nm. The oxide sintered compact used here was such that the tungsten content in the W/In atomic ratio was 0.035, and comprised only the $In_2O_3$ phase. Moreover, the film formation conditions for this oxide semiconductor thin film were the same as those of Example 1.

Next, the obtained amorphous oxide semiconductor thin film was crystallized by performing an annealing process for 30 minutes in an air atmosphere at 400° C., and as a result, the Si substrate, $SiO_2$ film and the crystalline oxide semiconductor thin film respectively formed a gate electrode, gate insulating layer and a channel layer.

After that, a 5 nm thick Ti film and a 100 nm thick Au film were sequentially formed on the surface of the channel layer by a direct-current magnetron sputtering method to form a source electrode and a drain electrode comprising layered Au/Ti films, and the thin film transistor (TFT element) having the construction illustrated in FIG. 1 was obtained. The film formation conditions for the source electrode and drain electrode were the same as the film formation conditions for the oxide semiconductor thin film except that the sputtering gas was only argon, and the direct-current power was 50W.

Furthermore, patterning was performed on the source electrode and drain electrode using a metal mask to obtain a TFT element having a 100 m channel length and 450 m channel width.

The performance characteristics of the obtained TFT element were investigated using a semiconductor parameter analyzer, and the performance characteristics as a TFT element were confirmed. Moreover, this TFT element was confirmed to have a good on/off ratio of $10^8$ or greater, and good electron field-effect mobility of 22.5 $cm^2$/Vsec.

Example 26

Except that the formation of a channel layer was performed using an oxide sintered compact that includes indium, zinc and tungsten as the sputtering target, the film formation of an oxide semiconductor thin film was performed in the same way as in Example 25. The oxide sintered compact that was used here was the same as in Example 13, in which the tungsten content in the W/In atomic ratio was 0.035, and the zinc content in the Zn/In atomic ratio was 0.01.

Next, the obtained amorphous oxide semiconductor thin film was crystallized by performing an annealing process for 30 minutes in an air atmosphere at 400° C., and as a result, the Si substrate, $SiO_2$ film and the crystalline oxide semiconductor thin film respectively formed a gate electrode, gate insulating layer and a channel layer.

After that, in the same way as in Example 25, a TFT element having a channel length of 100 m and a channel width of 450 m was obtained. The performance characteristics of the obtained TFT element were investigated using a semiconductor parameter analyzer, and the performance characteristics as a TFT element were confirmed. Moreover, this TFT element was confirmed to have a good on/off ratio of $10^8$ or greater, and good electron field-effect mobility of 18.7 $cm^2$/Vsec.

EXPLANATION OF REFERENCE NUMBERS

1 Gate electrode
2 Gate insulating layer
3 Channel layer
4 Source electrode
5 Drain electrode

What is claimed is:

1. An oxide semiconductor thin film comprising:
    an oxide including indium and tungsten,
    the oxide semiconductor thin film having a tungsten content in a W/In atomic ratio of 0.005 to 0.12; being crystalline; having only an $In_2O_3$ phase of bixbyite structure; and having a carrier density of $1 \times 10^{18}$ $cm^{-3}$ or less and a carrier mobility of higher than 1 $cm^2$/Vsec.

2. An oxide semiconductor thin film comprising:
    an oxide including indium, zinc and tungsten, the oxide semiconductor thin film having a tungsten content in a W/In atomic ratio of 0.005 to 0.12 and a zinc content in a Zn/In atomic ratio of 0.05 or less; being crystalline; having only an $In_2O_3$ phase of bixbyite structure; and having a carrier density of $1 \times 10^{18}$ $cm^{-3}$ or less and a carrier mobility of higher than 1 $cm^2$/Vsec.

3. The oxide semiconductor thin film according to claim 1, wherein the tungsten content in the W/In atomic ratio is 0.01 to 0.05.

4. The oxide semiconductor thin film according to claim 2, wherein the tungsten content in the W/In atomic ratio is 0.01 to 0.05, and the zinc content in the Zn/In atomic ratio is 0.003 to 0.03.

5. The oxide semiconductor thin film according to claim 1, having a film thickness of 15 to 200 nm.

6. The oxide semiconductor thin film according to claim 1, having a film thickness of 40 to 100 nm.

7. The oxide semiconductor thin film according to claim 1, having an average crystal grain size of 10 nm or greater.

8. The oxide semiconductor thin film according to claim 1, wherein the carrier mobility is 3 $cm^2$/Vsec or greater.

9. The oxide semiconductor thin film according to claim 1, wherein the carrier mobility is 10 $cm^2$/Vsec or greater.

10. The oxide semiconductor thin film according to claim 1, wherein the carrier density is within the range $1 \times 10^{16}$ to $1 \times 10^{17}$ $cm^{-3}$.

11. A thin film transistor comprising:
    a source electrode,
    a drain electrode,
    a gate electrode,
    a channel layer; and
    a gate insulating layer,
    wherein the channel layer comprises an oxide semiconductor thin film having an oxide including indium and tungsten,
    the oxide semiconductor thin film having a tungsten content in a W/In atomic ratio of 0.005 to 0.12; being

TABLE 3

|  | W/In | Zn/In | Annealing temperature (° C.) | Film thickness (nm) | Operation performance | on/off ratio | Electron field-effect mobility ($cm^2$/Vsec) |
|---|---|---|---|---|---|---|---|
| Ex-25 | 0.035 | — | 400 | 50 | ○ | $10^8$~ | 22.5 |
| Ex-26 | 0.035 | 0.01 | 400 | 50 | ○ | $10^8$~ | 18.7 |

(Ex = Example)

crystalline; having only an $In_2O_3$ phase of bixbyite structure; and having a carrier density of $1\times10^{18}$ cm$^{-3}$ or less and a carrier mobility of higher than 1 cm$^2$/Vsec.

* * * * *